(12) United States Patent
Chang et al.

(10) Patent No.: US 12,308,218 B2
(45) Date of Patent: May 20, 2025

(54) THERMAL SHIELD FOR PROCESSING CHAMBER

(71) Applicant: Applied Materials, Inc., Santa Clara, CA (US)

(72) Inventors: Youngki Chang, Santa Clara, CA (US); Muhannad Mustafa, Milpitas, CA (US); Kartik Shah, Saratoga, CA (US); Dhritiman Subha Kashyap, Bangalore (IN); Dhivanraj Subramanian, Tamil Nadu (IN)

(73) Assignee: Applied Materials, Inc., Santa Clara, CA (US)

( * ) Notice: Subject to any disclaimer, the term of this patent is extended or adjusted under 35 U.S.C. 154(b) by 411 days.

(21) Appl. No.: 17/685,046

(22) Filed: Mar. 2, 2022

(65) Prior Publication Data

US 2023/0282454 A1 Sep. 7, 2023

(51) Int. Cl.
*H01J 37/20* (2006.01)
*H01J 37/32* (2006.01)

(52) U.S. Cl.
CPC .. *H01J 37/32724* (2013.01); *H01J 37/32715* (2013.01); *H01J 37/32651* (2013.01)

(58) Field of Classification Search
CPC ........... H01J 37/32651; H01J 37/32715; H01J 37/20; H01J 37/32431–32513; C23C 14/50; C23C 16/458; C23C 16/4582; C23C 16/4583; C23C 16/4587; H01L 21/673; H01L 21/6735; H01L 21/67353; H01L 21/67383; H01L 21/68714

See application file for complete search history.

(56) References Cited

U.S. PATENT DOCUMENTS

| 6,046,439 A | 4/2000 | Johnsgard et al. |
| 6,620,289 B1 * | 9/2003 | Yan ........................ C23C 16/455 118/723 R |

(Continued)

FOREIGN PATENT DOCUMENTS

| EP | 0679730 B1 | 12/1999 |
| KR | 20180049312 A | 5/2018 |

OTHER PUBLICATIONS

PCT International Search Report and Written Opinion in PCT/US2023/014202 dated Jun. 19, 2023, 9 pages.

*Primary Examiner* — Aiden Lee
(74) *Attorney, Agent, or Firm* — SERVILLA WHITNEY LLC

(57) ABSTRACT

Processing chambers, substrate supports and thermal shields are described. A thermal shield comprises a disc-shaped body having a thickness, an outer diameter with a first edge and a second edge at opposite ends of a diameter of the disc-shaped body, a front surface and a back surface defining the thickness. The front surface has a first longitudinal region comprising the first edge and a second longitudinal region comprising the second edge. Coating one or more of the first longitudinal region or the second longitudinal region with an emissivity material (i.e., emissivity) reduces side to side temperature variation. In some embodiments, processing chambers having the thermal shield described herein consume less power than comparative processing chambers that do not include a thermal shield.

15 Claims, 3 Drawing Sheets

(56) References Cited

U.S. PATENT DOCUMENTS

| | | | |
|---|---|---|---|
| 2001/0015074 A1* | 8/2001 | Hosokawa | C23C 14/541 |
| | | | 62/378 |
| 2012/0052216 A1 | 3/2012 | Hanawa et al. | |
| 2012/0171377 A1 | 7/2012 | Volf et al. | |
| 2013/0126515 A1* | 5/2013 | Shero | H01L 21/67115 |
| | | | 219/448.11 |
| 2014/0000843 A1 | 1/2014 | Dunn et al. | |
| 2021/0166921 A1 | 6/2021 | Neville et al. | |
| 2021/0384033 A1 | 12/2021 | Miyama | |
| 2022/0333239 A1* | 10/2022 | Saurabh | H01J 37/32724 |

\* cited by examiner

THERMAL SHIELD FOR PROCESSING CHAMBER

TECHNICAL FIELD

Embodiments of the disclosure generally relate to thermal shields. More particularly, embodiments of the disclosure are directed to substrate supports and processing chambers having thermal shields for reducing side to side temperature variation.

BACKGROUND

Conventional processing chambers include a substrate support having a support surface and a back surface defining a thickness of the support body, and a heater within the thickness of the support body. These processing chambers often experience side to side variation in temperature of the support surface during heating. These conventional processing chambers typically have a non-symmetric liner situated between the substrate support surface and the heater. In such cases, a slit valve side of the liner typically has a higher temperature than a pumping port side. Thus, it is challenging to reduce side to side temperature variation in conventional processing chambers. Reducing side to side variation can advantageously lower temperature and power consumption needed to heat the support surface.

There is, therefore, a need in the art reduce side to side variation in temperature in a substrate support surface and processing chambers which consume less power.

SUMMARY

One or more embodiments of the disclosure are directed to a thermal shield. In some embodiments, the thermal shield comprises a disc-shaped body having a thickness, a central axis and an outer diameter with a first edge and a second edge at opposite ends of a diameter of the disc-shaped body. A front surface and a back surface define the thickness of the disc-shaped body. The front surface of the disc-shaped body comprises a first longitudinal region comprising the first edge and a second longitudinal region comprising the second edge. The first longitudinal region has one or more of a low emissivity or an intermediate emissivity, and the second longitudinal region has one or more of an intermediate emissivity or a high emissivity, the high emissivity greater than or equal to 0.2 greater than the low emissivity.

Additional embodiments of the disclosure are directed to a substrate support. In some embodiments, the substrate support comprises a support body having a support surface and a back surface defining a thickness of the support body, a heater is within the thickness of the support body; and a thermal shield comprising a disc-shaped body having a thickness, a central axis and an outer diameter with a first edge and a second edge at opposite ends of a diameter of the disc-shaped body. A front surface and a back surface define the thickness of the disc-shaped body. The front surface of the disc-shaped body comprises a first longitudinal region comprising the first edge and a second longitudinal region comprising the second edge. The first longitudinal region has one or more of a low emissivity or an intermediate emissivity, and the second longitudinal region has one or more of an intermediate emissivity or a high emissivity, the high emissivity greater than or equal to 0.2 greater than the low emissivity.

Further embodiments of the disclosure are directed to a processing chamber. In some embodiments, the processing chamber comprises a chamber body having a top wall, a bottom wall and a sidewall containing an interior volume. In some embodiments, the processing chamber comprises a substrate support within the interior volume, the substrate support comprising a support shaft with a support body on an end of the support shaft. The support body has a support surface and a back surface defining a thickness of the support body, and a heater is within the thickness of the support body. In some embodiments, the processing chamber comprises a thermal shield comprising a disc-shaped body having a thickness, a central axis and an outer diameter with a first edge and a second edge at opposite ends of a diameter of the disc-shaped body. A front surface and a back surface define the thickness of the disc-shaped body. The front surface of the disc-shaped body comprises a first longitudinal region comprising the first edge and a second longitudinal region comprising the second edge. The first longitudinal region has one or more of a low emissivity or an intermediate emissivity, and the second longitudinal region has one or more of an intermediate emissivity or a high emissivity, the high emissivity greater than or equal to 0.2 greater than the low emissivity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, "substrate support" and "substrate support pedestal" may be used interchangeably.

As used in this specification and appended claims, use of relative terms like "above" and "below" should not be taken as limiting the scope of the disclosure to a physical orientation in space. Accordingly, use of relative terms should not be limited to the direction specified by gravity.

Embodiments of the disclosure advantageously provide a thermal shield for a substrate support and for processing chambers to reduce side to side variation in temperature of substrate support surfaces. Embodiments of the disclosure advantageously provide processing chambers which consume less power than comparative processing chambers that do not include a thermal shield as described herein.

Figure 1:
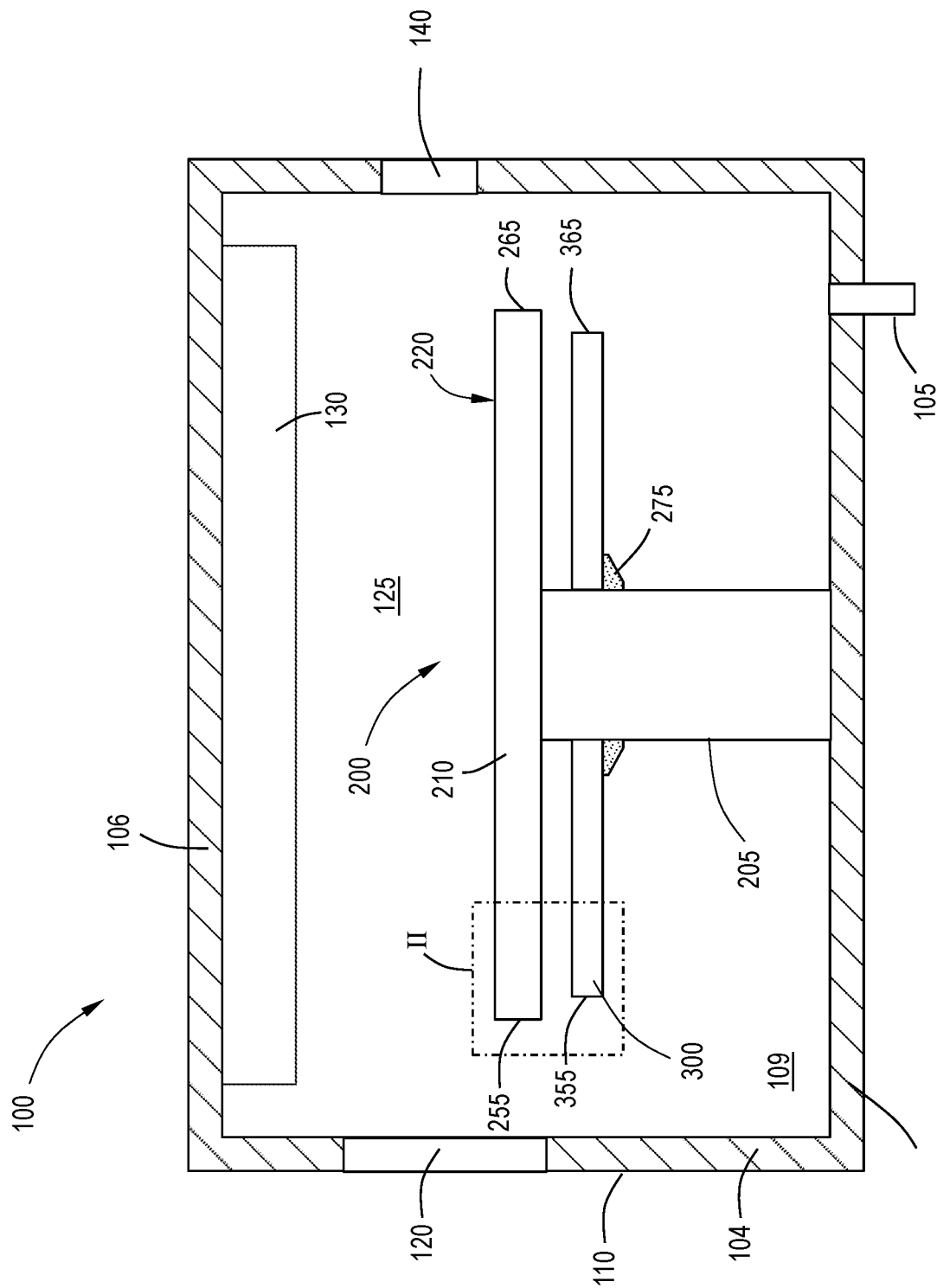
FIG. 1 illustrates a schematic cross-sectional view of a processing chamber according to one or more embodiments of the disclosure.
Figure 2:
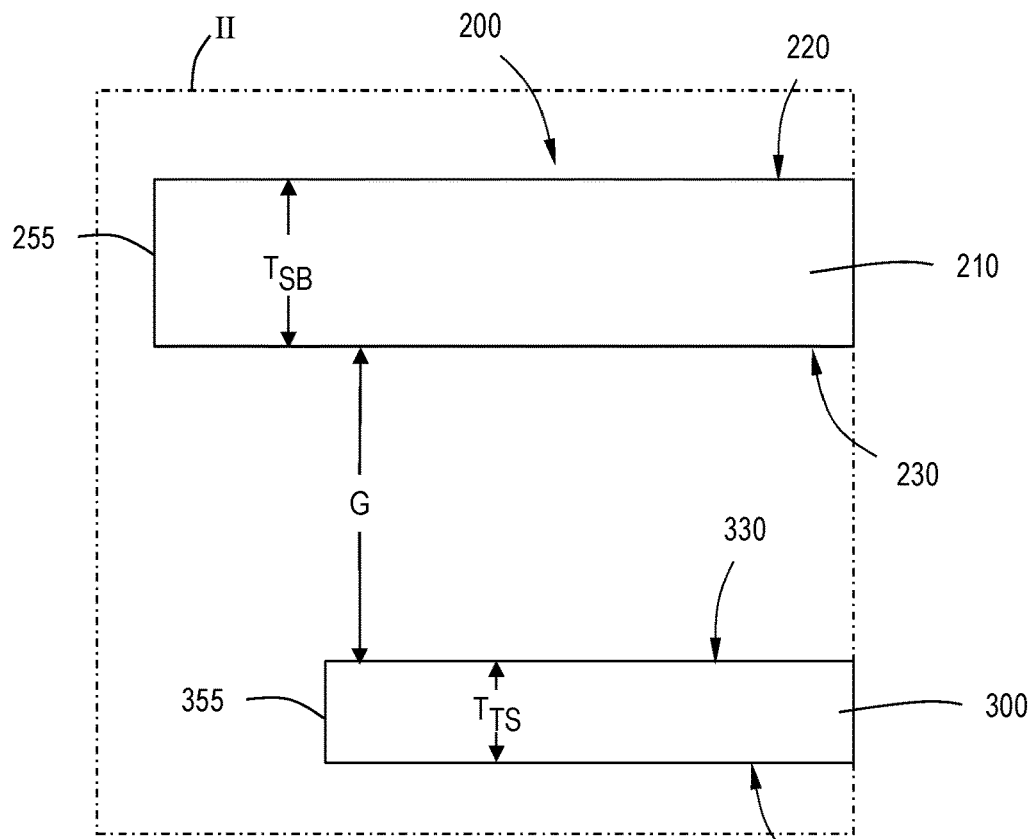
FIG. 2 illustrates an enlarged view of region II of FIG. 1.
Figure 3:
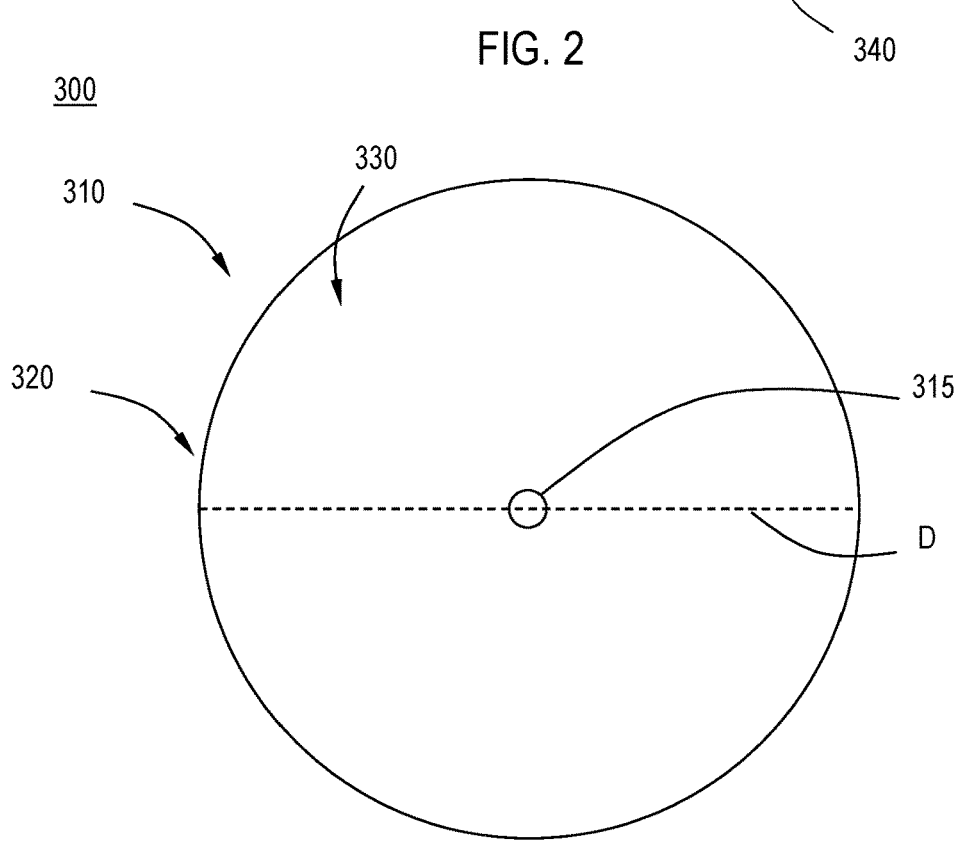
FIG. 3 illustrates a schematic top view of a thermal shield according to one or more embodiments of the disclosure.

The disclosure provides methods for use with single wafer processing chambers 100. FIG. 1 shows the processing chamber 100 illustrated as a schematic cross-sectional view according to one or more embodiments of the disclosure. FIG. 2 shows an enlarged view of region II of the processing chamber 100 of FIG. 1. The enlarged view of FIG. 2 illustrates a substrate support 200 and a thermal shield 300.

The processing chamber 100 has a chamber body 110 with a top wall 106 (i.e., a processing chamber lid), at least one sidewall 104 and a bottom 102. The chamber body 110 along with the top wall 106 define an interior volume 109. The processing chamber 100 has a gas injector 130 (also referred to as a gas distribution plate or a showerhead). The type of gas injector 130 used will depend on, for example, the type of process being performed and the type of showerhead or gas injector. For example, a processing chamber 100 configured to operate as an atomic layer deposition apparatus may have a showerhead or vortex type gas injector. A processing chamber 100 configured to operate as a plasma station may have one or more electrode and/or grounded plate configuration to generate a plasma while allowing a plasma gas to flow toward the substrate.

In FIG. 1, the processing chamber 100 has a substrate support 200 within the interior volume 109. Referring to FIGS. 1 and 2, the substrate support 200 comprises a support shaft 205, a support body 210 having a support surface 220 and a back surface 230 defining a thickness TSB of the support body 210, and a heater (not shown) within the thickness TSB of the support body 210. The heater can be any suitable heater known to the skilled artisan including, but not limited to, resistive heater. In some embodiments, the support body 210 comprises an electrostatic chuck and includes one or more electrodes for chucking a wafer to the support surface 220. In some embodiments, the thickness TSB of the support body 210 is in a range of from 0.25 inches to 1 inch.

In some embodiments, the substrate support 200 comprises a support bracket 275 to support the thermal shield 300. The support bracket 275 may be any suitable support mechanism known to the skilled artisan. The support bracket 275 of some embodiments comprises a split body design allowing the support bracket 275 to be positioned around an existing support shaft 205.

Without intending to be bound by any particular theory of operation, power consumption is the amount of power needed to heat the substrate support surface 220. The inventors have discovered that processing chambers 100 having the thermal shield 300 described herein consume less power, e.g., a power consumption reduction of at least 10%, including at least 15% or at least 20%, as compared to processing chambers that do not include a thermal shield.

In the illustrated embodiment of FIG. 1, the processing chamber 100 has a slit valve 120 on the left side and a pump port 140 on the right side. The skilled artisan will recognize that the particular arrangement of the slit valve 120 and the pump port 140 is merely exemplary and should not be taken as limiting the scope of the disclosure. As used herein, the term "slit valve" refers to an area that may be opened or closed, the area configured to allow for insertion and removal of a substrate.

The processing chamber 100 typically includes a vacuum source (not shown) connected to an exhaust port 105 for maintaining a reduced pressure state within the interior volume 109. A space between the support surface 220 of the support body 210 and the gas distribution plate 130 is referred to as the process region 125. In some embodiments, a pump port 140 is positioned adjacent the process region 125 to evacuate gases from the process region 125. In some embodiments, the pump port 140 is connected to a vacuum source (not shown) for evacuation purposes. The vacuum source connected to the pump port 140 can be the same source or different source than that connected to the exhaust port 105.

One or more embodiments of the thermal shield 300 are illustrated in FIGS. 2-5. The thermal shield 300 comprises a disc-shaped body 310 having a thickness TTS, a central axis 315 and an outer diameter 320. In some embodiments, the thickness TTS of the disc-shaped body 310 of the thermal shield 300 is in a range of from 0.05 inches to 0.5 inches. While the thermal shield 300 has disc-shape, one side of the disc is closest to the slit valve 120 and another side is closest to the pump port 140. In embodiments where the slit valve 120 and the pump port 140 are on opposite sides of the process chamber, the thermal shield 300 has a first edge 355 and a second edge 365 at opposite ends of a diameter D of the disc-shaped body 310. In embodiments where the slit valve 120 and the pump port 140 are spaced at different apart by different angles relative to the central axis 315 than 180°, the first edge 355 and second edge 365 are at points on the circumference of the disc-shaped body closest to each of the slit valve 120 and the pump port 140.

The disc-shaped body 310 may comprise any suitable material known to the skilled artisan. In some embodiments, the disc-shaped body 310 comprises aluminum. In some embodiments, the disc-shaped body 310 comprises stainless steel, a ceramic material, or quartz material.

Figure 4:
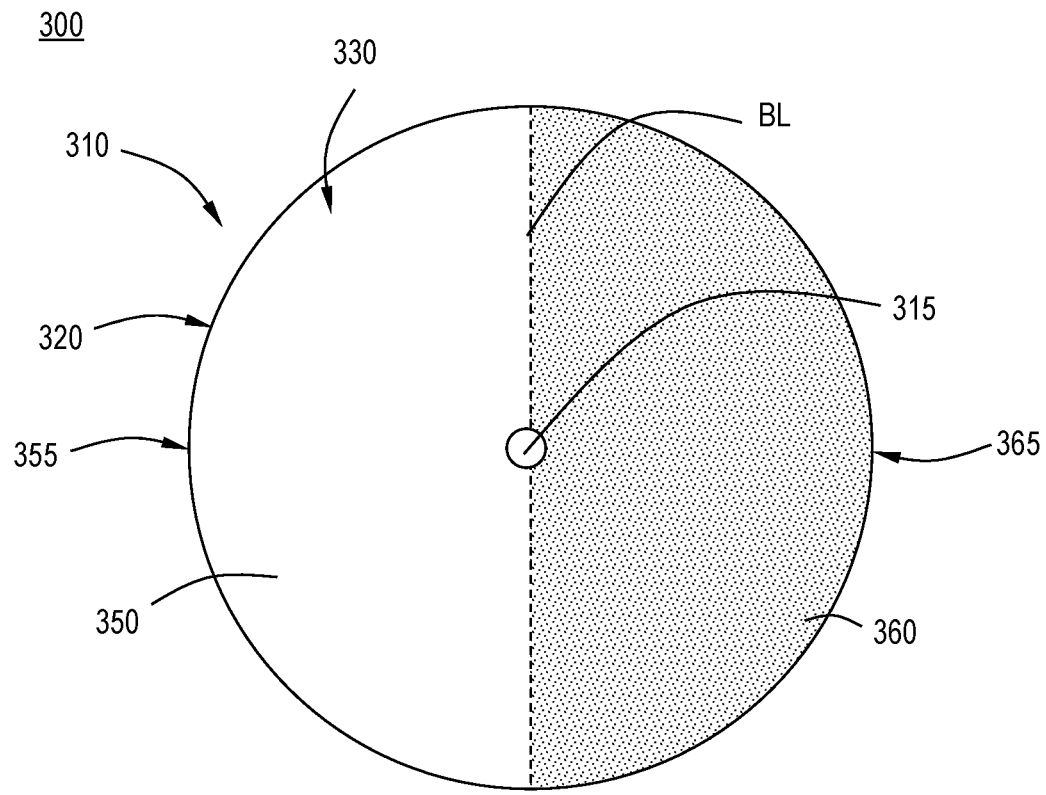
FIG. 4 illustrates a schematic top view of the thermal shield of FIG. 3.
Figure 5:
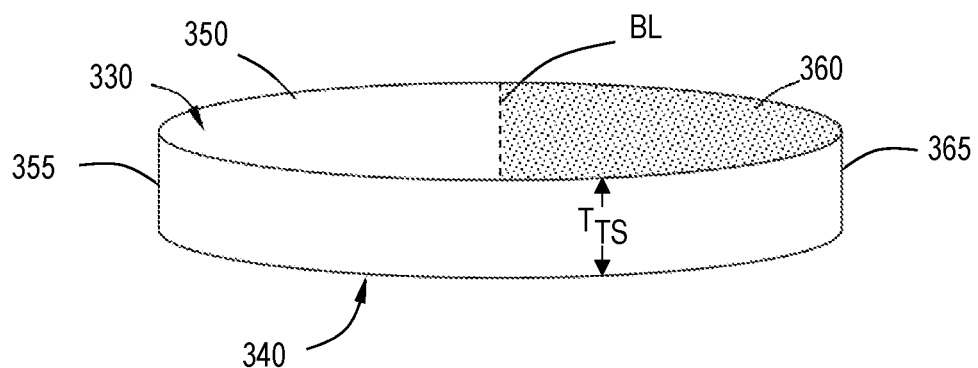
FIG. 5 illustrates a schematic isometric view of a thermal shield according to one or more embodiments of the disclosure.

The disc-shaped body 310 has a front surface 330 and a back surface 340 that define the thickness TTS of the disc-shaped body 310. In some embodiments, as illustrated in FIGS. 4 and 5, the front surface 330 comprises a first longitudinal region 350 comprising the first edge 355 and a second longitudinal region 360 comprising the second edge 365. In one or more embodiments, the support body 210 comprises a first edge 255 (i.e., a first side) and a second edge 265 (i.e., a second side). In some embodiments, the first edge 255 and the second edge 265 of the support body 210 are aligned with the first edge 355 and the second edge of the 365 of the disc-shaped body 310 of the thermal shield 300.

The use of "first" and "second" to describe the edges and sides of the components are used to denote that the components, parts or regions are different and should not be taken as limiting the scope of the disclosure to any particular physical orientation. For example, in some embodiments, the first edge 355 is aligned with the slit valve 120 and in some embodiments, the second edge 365 is aligned with the pump port 140. In some embodiments, the first edge 355 is aligned with the pump port 140 and in some embodiments, the second edge 365 is aligned with the slit valve 120.

Referring to FIGS. 4-5, in some embodiments, the first longitudinal region 350 extends a distance from the first edge 355 toward the central axis 315 along the diameter D. In some embodiments, the second longitudinal region 360 extends a distance from the second edge 365 toward the central axis 315 along the diameter D. In some embodiments, the first longitudinal region 350 extends to the second longitudinal region 360 forming a boundary line BL extending perpendicular to the diameter D. In some embodiments, the boundary line BL passes through the central axis 315 so that 50% of a surface area of the front surface 330 comprises the first longitudinal region 350 and 50% of the surface area of the front surface 330 comprises the second longitudinal region 360. In some embodiments, the boundary line BL crosses the diameter D at a point within 30% to 70% of a distance from the first edge 355 to the second edge 365.

The inventors have surprisingly found that coating one or more of the first longitudinal region 350 or the second longitudinal region 360 with materials having different emissivities reduces side to side temperature variation. Without intending to be bound by any particular theory of operation, it is believed that emissivity may be controlled by changing conditions on a surface, such as, applying a finish or coating on the surface. In some embodiments, the first longitudinal region 350 has one or more of a low emissivity or an intermediate emissivity. In some embodiments, the second longitudinal region 360 having one or more of an intermediate emissivity or a high emissivity.

Without intending to be bound by any particular theory of operation, emissivity is an amount of thermal energy radiated from a material's surface. In some embodiments, a material's emissivity is in a range of from 0 to 1. In some embodiments, the emissivity material (i.e., emissivity) can be any suitable material known to the skilled artisan. In some embodiments, the low emissivity is in a range of from 0 to 0.35, including less than or equal to 0.2. In some embodiments, the low emissivity is about 0.15. In some embodiments, the low emissivity comprises a clean aluminum surface. In some embodiments, the intermediate emissivity is in a range of 0.36 to 0.65. In some embodiments, the intermediate emissivity is about 0.6. In some embodiments, the intermediate emissivity comprises an anodized aluminum surface. In some embodiments, the high emissivity is in a range of 0.66 to 1. In some embodiments, the high emissivity is about 0.8. In some embodiments, the high emissivity comprises a black coating. In some embodiments, the high emissivity is greater than or equal to 0.2 greater than the low emissivity.

The inventors have discovered that each of the first longitudinal region 350 and the second longitudinal region 360 having an emissivity reduces side to side variation in temperature of a surface (e.g., a surface of a substrate support) when the thermal shield 300 is positioned a distance from the surface (e.g., a surface of a substrate support).

Referring again to FIG. 2, in some embodiments, the thermal shield 300 is positioned a distance from the support body 210 so that there is a gap G between the back surface 230 of the support body 210 and the front surface 330 of the thermal shield 300. The gap G between the back surface 230 of the support body 210 and the front surface 330 of the thermal shield 300 can be adjusted by any suitable means known to the skilled artisan. Stated differently, the thermal shield 300 may be positioned so that the front surface 330 of the thermal shield 300 can be closer to or farther away from the back surface 230 of the support body 210, thereby decreasing or increasing the size of the gap G. Without intending to be bound by any particular theory of operation, it is believed that as the gap G between the back surface 230 of the support body 210 and the front surface 330 of the thermal shield 300 gets larger, the emissivity affect is reduced and reduction in side to side temperature variation is reduced. In some embodiments, the gap G between the back surface 230 of the support body 210 and the front surface 330 of the thermal shield 300 is less than or equal to 10 mm. In some embodiments, the gap G between the back surface 230 of the support body 210 and the front surface 330 of the thermal shield 300 is 6 mm.

The inventors have discovered that each of the first longitudinal region 350 and the second longitudinal region 360 having an emissivity reduces side to side variation in temperature of the support surface 220 of the substrate support 200. In some embodiments, the temperature of the support surface 220 is measured along one or more of the first edge 255 or the second edge 265 of the support body 210. The temperature may be measured by any method or by using any instrument known to the skilled artisan.

In some embodiments, the first longitudinal region 350 and the second longitudinal region 360 are configured to reduce side to side variation in temperature of the support surface 220.

In some embodiments, the first longitudinal region 350 has an emissivity of 0.15 (e.g., a low emissivity) on the first edge 355. In some embodiments, the second longitudinal region 360 has an emissivity of 0.8 (e.g., a high emissivity) on the second edge 365. In some embodiments, when the first longitudinal region 350 has an emissivity of 0.15 (e.g., a low emissivity) on the first edge 355 and the second longitudinal region 360 has an emissivity of 0.8 (e.g., a high emissivity) on the second edge 365 and the gap G between the back surface 230 of the support body 210 and the front surface 330 of the thermal shield 300 is 6 mm, there is a temperature variation between the first edge 355 and the second edge 365 that may be in a range of from 3° C. to 4° C.

In some embodiments, the first longitudinal region 350 has an emissivity of 0.15 (e.g., a low emissivity) on the first edge 355. In some embodiments, the second longitudinal region 360 has an emissivity of 0.6 (an intermediate emissivity) on the second edge 365. In some embodiments, when the first longitudinal region 350 has an emissivity of 0.15 (e.g., a low emissivity) on the first edge 355 and the second longitudinal region 360 has an emissivity of 0.6 (e.g., an intermediate emissivity) on the second edge 365 and the gap G between the back surface 230 of the support body 210 and the front surface 330 of the thermal shield 300 is 6 mm, there is a temperature variation between the first edge 355 and the second edge 365 that may be in a range of from 2° C. to 3° C.

In some embodiments, the first longitudinal region 350 has an emissivity of 0.6 (e.g., an intermediate emissivity) on the first edge 355. In some embodiments, the second longitudinal region 360 has an emissivity of 0.8 (e.g., a high emissivity) on the second edge 365. In some embodiments, when the first longitudinal region 350 has an emissivity of 0.6 (e.g., an intermediate emissivity) on the first edge 355 and the second longitudinal region 360 has an emissivity of 0.8 (e.g., a high emissivity) on the second edge 365 and the gap G between the back surface 230 of the support body 210 and the front surface 330 of the thermal shield 300 is 6 mm, there is a temperature variation between the first edge 355 and the second edge 365 that may be less than or equal to 2° C., including less than or equal to 1° C.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A substrate processing chamber comprising:
    a chamber body having a top wall, a bottom wall and a sidewall containing an interior volume and a process region;
    a pump port positioned on a first side of the sidewall of the chamber body adjacent to the process region and configured to evacuate gases from the process region and a slit valve positioned on a second side of the sidewall of the chamber body and opposite the first side;
    a substrate support within the interior volume, the substrate support comprising a support shaft with a support body on an end of the support shaft, the support body having a support surface and a back surface defining a thickness of the support body, a heater is within the thickness of the support body; and
    a thermal shield comprising a disc-shaped body having a thickness, a central axis and a diameter with a first edge on a first side of the disc-shaped body positioned adjacent to the pump port and a second edge on a second side of the disc-shaped body positioned adjacent to the slit valve, the first edge and the second edge at opposite ends of a diameter of the disc-shaped body, a front surface and a back surface that define the thickness of the disc-shaped body, the thermal shield positioned along the support shaft at a distance from the support body so that there is a gap between the back surface of the support body and the front surface of the thermal shield, the front surface of the disc-shaped body comprising a first longitudinal region comprising the first edge and extending a distance from the first edge toward the central axis and a second longitudinal region comprising the second edge and extending a distance from the second edge toward the central axis along the diameter, the first longitudinal region having a first emissivity in a range of from 0 to 0.35 and the second longitudinal region having a second emissivity in a range of from 0.36 to 1 and the first longitudinal region and the second longitudinal region are configured to reduce side to side temperature variation of the support surface.

2. The substrate processing chamber of claim 1, wherein the disc-shaped body comprises aluminum.

3. The substrate processing chamber of claim 2, wherein the first emissivity comprises a clean aluminum surface and the second emissivity comprises a black coating.

4. The substrate processing chamber of claim 3, wherein the first longitudinal region forms a boundary line extending perpendicular to the diameter.

5. The substrate processing chamber of claim 4, wherein the boundary line passes through the central axis so that 50% of a surface area of the front surface comprises the first longitudinal region and 50% of the surface area of the front surface comprises the second longitudinal region.

6. The substrate processing chamber of claim 4, wherein the boundary line crosses the diameter at a point within 30% to 70% of a distance from the first edge to the second edge.

7. The substrate processing chamber of claim 1, wherein the second emissivity is in a range of from 0.66 to 1.

8. The substrate processing chamber of claim 7, wherein the second emissivity comprises an anodized aluminum surface.

9. The substrate processing chamber of claim 8, wherein the second emissivity is about 0.8.

10. The substrate processing chamber of claim 1, wherein a size of each of the first longitudinal region and the second longitudinal region reduce side to side variation in temperature of the support surface positioned within 10 mm of the front surface.

11. The substrate processing chamber of claim 1, wherein the first longitudinal region has an emissivity of 0.15 on the first edge and the second longitudinal region has an emissivity of 0.8 on the second edge.

12. The substrate processing chamber of claim 1, wherein the first longitudinal region has an emissivity of 0.15 on the first edge and the second longitudinal region has an emissivity of 0.6 on the second edge.

13. The substrate processing chamber of claim 1, wherein the first longitudinal region has an emissivity of 0.6 on the first edge and the second longitudinal region has an emissivity of 0.8 on the second edge.

14. The substrate processing chamber of claim 1, wherein the gap is less than or equal to 10 mm.

15. The substrate processing chamber of claim 1, wherein the gap is 6 mm.

* * * * *